United States Patent
Hernandez et al.

(10) Patent No.: US 11,316,507 B2
(45) Date of Patent: Apr. 26, 2022

(54) PULSE WIDTH MODULATION (PWM) SIGNAL GENERATOR

(71) Applicant: Texas Instruments Incorporated, Dallas, TX (US)

(72) Inventors: David Hernandez, Fort Worth, TX (US); David Patrick Magee, Allen, TX (US); Mohit Chawla, Bengaluru (IN); James Kelly Griffin, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/364,489

(22) Filed: Jun. 30, 2021

(65) Prior Publication Data
US 2022/0021379 A1    Jan. 20, 2022

Related U.S. Application Data

(60) Provisional application No. 63/053,145, filed on Jul. 17, 2020.

(51) Int. Cl.
*H03K 7/08*    (2006.01)
(52) U.S. Cl.
CPC ..................... *H03K 7/08* (2013.01)
(58) Field of Classification Search
CPC ................. H03K 3/017; H03K 7/08
See application file for complete search history.

(56) References Cited

U.S. PATENT DOCUMENTS

| | | | | |
|---|---|---|---|---|
| 10,566,962 | B2* | 2/2020 | Ido | H03F 3/2173 |
| 2015/0070088 | A1* | 3/2015 | Ding | H03K 7/08 |
| | | | | 327/551 |
| 2015/0130549 | A1* | 5/2015 | Seebacher | H03K 7/08 |
| | | | | 332/109 |
| 2016/0266379 | A1 | 9/2016 | Li et al. | |
| 2021/0226612 | A1* | 7/2021 | Grout | H03K 3/017 |

* cited by examiner

*Primary Examiner* — Patrick O Neill
(74) *Attorney, Agent, or Firm* — Mark Allen Valetti; Charles A. Brill; Frank D. Cimino

(57) ABSTRACT

Techniques are provided herein for generating PWM signals. Furthermore, a direct-drive method is disclosed in which a PWM signal is generated as a differential signal made up of OUTP and OUTN signals, where OUTP is a copy of OUTN but shifted in time by half a period. The PWM signal is generated by passing each of an input period and an input duty cycle through corresponding sigma-delta circuits to generate a refined period and a refined duty cycle, respectively. In some example cases, a threshold mapper uses a lookup table (LUT) or similar mechanism to select timing thresholds for rise times and fall times for each of the OUTP and OUTN signals, where the timing thresholds are selected based on the refined period and the refined duty cycle. In some example cases, a pulse generator generates the OUTP and OUTN signals based on the timing thresholds.

24 Claims, 7 Drawing Sheets

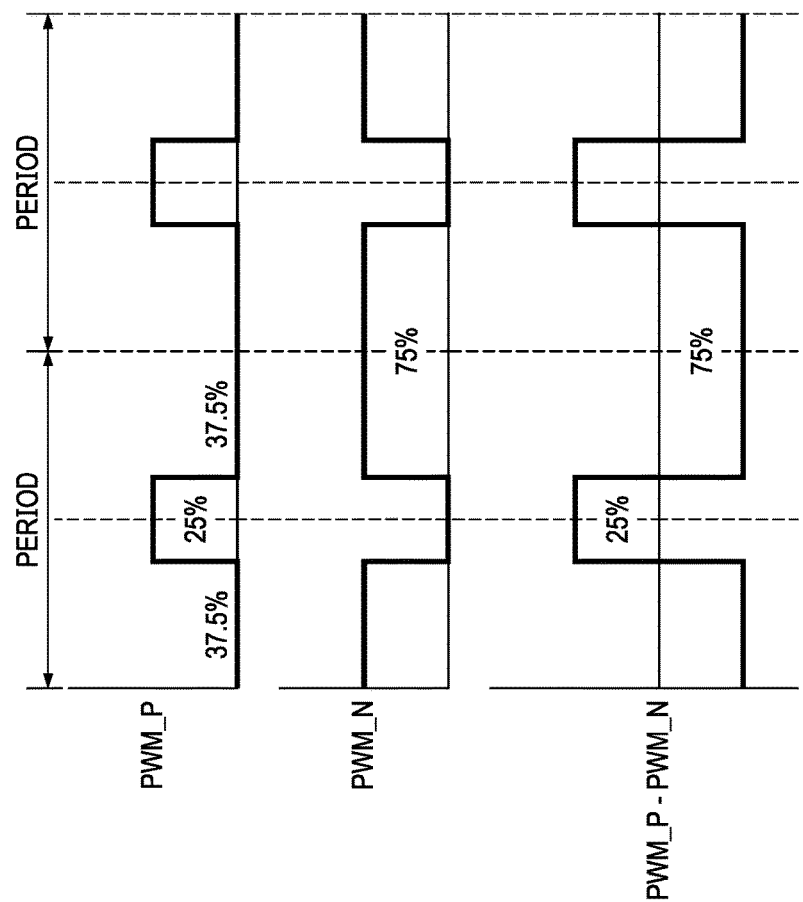
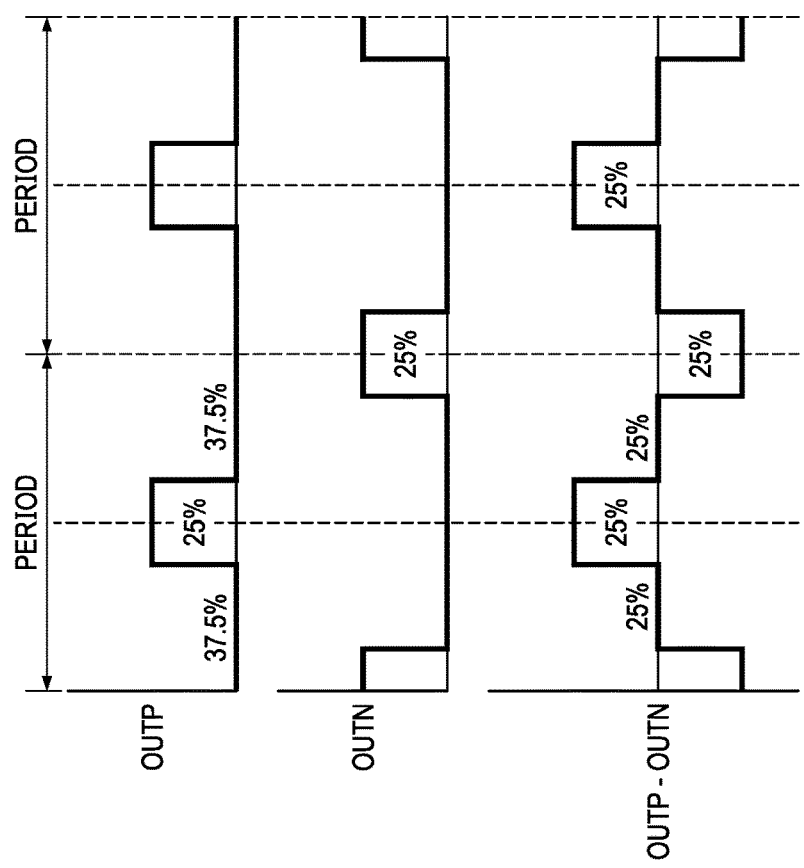
FIG. 5B
FIG. 5A

PULSE WIDTH MODULATION (PWM) SIGNAL GENERATOR

RELATED APPLICATION

This application claims the benefit of and priority to U.S. provisional patent application No. 63/053,145 filed on 17 Jul. 2020, which is herein incorporated by reference in its entirety.

FIELD OF THE DISCLOSURE

This disclosure relates to signal generators, and more particularly, to pulse width modulation (PWM) signal generators.

BACKGROUND

Pulse width modulation (PWM) is a signal modulation or control technique that includes the generation of variable-width pulses to effectively represent the amplitude of an analog output signal. Although there are many applications where PWM can be used, one such example is in the context of a switching power converter, in which a switching device of the converter is driven by a PWM signal (such as where the PWM signal is applied to the gate of a field effect transistor) which in turn causes the converter to output an analog signal. The PWM signal has a period that is the inverse of the switching frequency and includes an on-portion where the PWM signal is high or otherwise active, and an off-portion where the PWM signal is low or otherwise inactive. The proportion of the on-portion to the period is referred to as the duty cycle, which is expressed in percentage. For instance, a 60% duty cycle refers to the case where the PWM signal is active (high) for 60% of a given period and is inactive (low) for the remaining 40% of that period. In the context of a converter, the duty cycle can be adjusted to provide a desired output voltage. Other example PWM applications include, for instance, motor control, heater control, fan control, lighting control, or audio amplifier control.

The resolution of a PWM generator refers to the number of discrete steps for modulating the duty cycle from the lowest power setting to the highest power setting. For instance, a PWM that has a 10-bit resolution has 1024 steps from zero (0% duty cycle) to full power (100% duty cycle). Each step can correspond to a different output signal, depending on the application, such as a different analog output voltage (for a power converter application), or a different speed (for a fan or motor application), or a different temperature level (for a heater application), or a different sound (for an audio effect application). The PWM resolution is effectively defined as the ratio of the PWM clock frequency to the PWM signal frequency. For example, given a PWM clock speed of 10.24 MHz and a PWM signal frequency of 10 kHz, the PWM resolution would be 1,024, or 10 bits ($2^{10}$=1024). Note that the ratio need not correspond precisely to a power of 2. For instance, if the ratio yielded 1,050, the resolution could be characterized as more than 10-bits, but not quite 11-bits).

To this end, producing a PWM signal with a high-resolution can be accomplished by using a similarly high frequency PWM clock, but doing so may be expensive in both power and chip area. In more detail, the PWM clock is commonly provided by an oscillator. Because the power dissipation of an oscillator (for generating the PWM clock) is approximately proportional to frequency, a relatively high clock frequency implicates a relatively high power dissipation. So, if low power dissipation is desired for a given application, then simply using a higher clock frequency to provide a large ratio between the PWM clock frequency and the PWM signal frequency is undesirable. One possible solution for obtaining high-resolution with a relatively low frequency clock involves the use of multi-phase delay locked loops, which can be used to divide the PWM clock cycle (or main period) up into smaller periods to achieve a finer resolution for the PWM signal. Unfortunately, such a solution requires the use of additional logic that constantly changes the number of delay cells being selected in the loop to achieve the finer period accuracy, and further requires the use of calibration of the analog delay chain to account for semiconductor process, voltage, and/or temperature variations.

Accordingly, there remain a number of non-trivial issues associated with generating PWM signals.

SUMMARY

Techniques are disclosed for generating PWM signals. The techniques can be embodied, for example, in a controller or an integrated circuit (e.g. a semiconductor die).

One example is a PWM generator that includes a first sigma-delta circuit having a period input and a refined period output, a second sigma-delta circuit having a duty cycle input and a refined duty cycle output, a threshold mapper coupled to the refined period output of the first sigma-delta circuit and the refined duty cycle output of the second sigma-delta circuit, and a pulse generator. The threshold mapper has a first timing threshold output, a second timing threshold output, a third timing threshold output, and a fourth timing threshold output. The pulse generator is coupled to the first, second, third, and fourth timing threshold outputs of the threshold mapper and has at least one pulse width modulation (PWM) signal output.

Another example is a circuit for exciting a piezoelectric transducer. The circuit includes a first sigma-delta circuit having a period input and a refined period output, a second sigma-delta circuit having a duty cycle input and a refined duty cycle output, a threshold mapper coupled to the refined period output of the first sigma-delta circuit and the refined duty cycle output of the second sigma-delta circuit, a pulse generator, and circuitry. The threshold mapper has a first threshold output, a second threshold output, a third threshold output, and a fourth threshold output. The pulse generator is coupled to the first, second, third, and fourth threshold outputs of the threshold mapper and has a first pulse width modulation (PWM) signal output and a second PWM signal output. The circuitry is coupled to the first PWM signal output and the second PWM signal output and has an analog output adapted to be coupled to the piezoelectric transducer.

Another example is a PWM generator that includes a first sigma-delta circuit, a second sigma-delta circuit, a threshold mapper, and a pulse generator. The first sigma-delta circuit is designed to receive an input period for a PWM signal, refine the input period using a first scalar factor to produce a refined period, and output the refined period. The second sigma-delta circuit is designed to receive an input duty cycle for the PWM signal, refine the input duty cycle using a second scalar factor to produce a refined duty cycle, and output the refined duty cycle. The threshold mapper is designed to generate timing thresholds for a rise time and a fall time of the PWM signal based on both the refined period and the refined duty cycle. The pulse generator is designed to receive the timing thresholds from the threshold mapper, and produce the PWM signal based on the timing thresholds.

Another example is a method for generating a PWM signal. The method includes receiving an input period for the PWM signal at a first sigma-delta circuit; refining, using the first sigma-delta circuit, the input period using a first scalar factor to produce a refined period; receiving an input duty cycle for the PWM signal at a second sigma-delta circuit; refining, using the second sigma-delta circuit, the input duty cycle using a second scalar factor to produce a refined duty cycle; generating timing thresholds for a rise time and a fall time of the PWM signal based on both the refined period and the refined duty cycle; and generating an OUTP square wave signal having the refined period (P) and the refined duty cycle based on the timing thresholds, and generating an OUTN square wave signal having the refined period (P) and the refined duty cycle based on the timing thresholds, wherein the OUTP square wave signal is shifted in time with respect to the OUTN square wave signal by P/2.

BRIEF DESCRIPTION OF THE DRAWINGS

FIG. 5A illustrates another example timing diagram for the differential square wave output of the PWM generator showing direct-drive modulation, in accordance with an embodiment of the present disclosure.

FIG. 5B illustrates a timing diagram for a differential square wave output of a PWM generator using a different uniform-sampled modulation technique.

The same reference numbers or other reference designators are used in the drawings to designate the same or similar (functionally and/or structurally) features.

DETAILED DESCRIPTION

Figure 1:
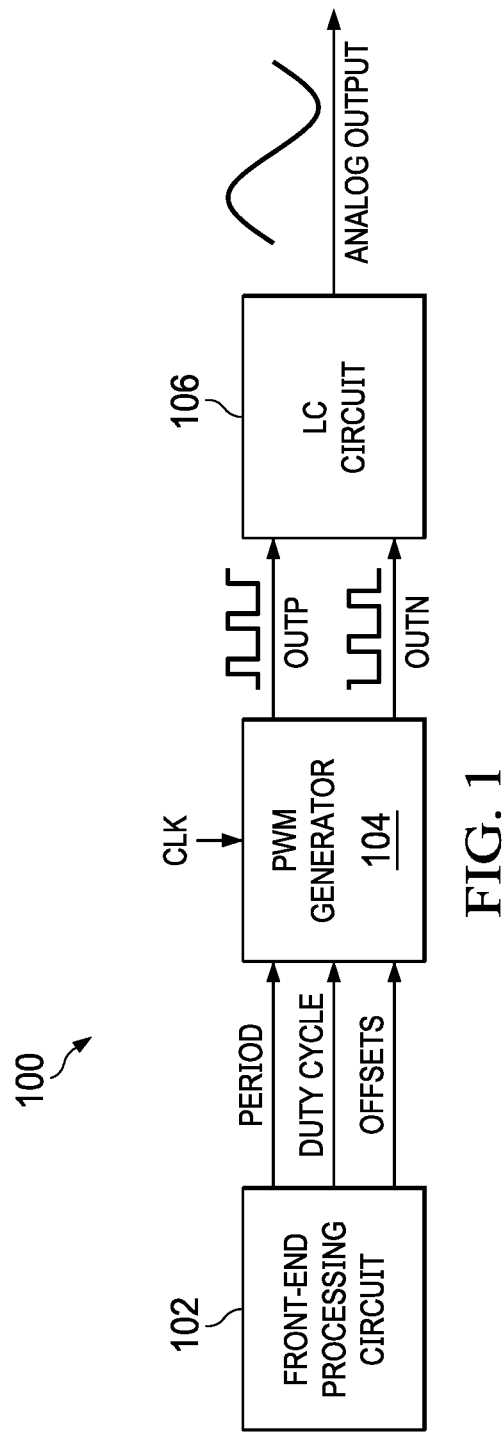
FIG. 1 is a block diagram of an example signal generator for producing an analog output signal and which includes a PWM generator, in accordance with an embodiment of the present disclosure.

Techniques are provided herein for generating PWM signals. Although the techniques can be used in any number of applications, they are particularly well-suited for generating relatively high resolution PWM signals, using a relatively low frequency clock, according to some embodiments. Examples of such applications include the cases where the generated PWM signal is, for instance, used for exciting a piezoelectric transducer in an ultrasonic lens cleaning application, or controlling a switching device in a power converter application. In one such example case, for ultrasonic lens cleaning, PWM signals are generated (using a lower frequency clocking signal) for use in efficiently exciting a piezoelectric transducer (to ultrasonically clean the lens) at a particular frequency while reducing energy provided to the harmonic frequencies that do not efficiently excite the transducer. Furthermore, a method is provided in which a PWM signal is generated as a differential drive signal made up of an OUTP and OUTN signal, where OUTP is a copy of OUTN but shifted in time by half a period. In some cases, the resulting drive signal can be a direct-drive PWM signal, meaning that the frequency of the generated PWM signal matches the frequency of the given application. For instance, for an ultrasonic lens cleaning application, the PWM frequency of the generated direct-drive PWM signal matches the excitation frequency (the frequency at which it is desired to move an actuator connected as a load). In a more general sense, a direct-drive PWM signal can be applied directly to a load or circuit being driven, so as to provide direct-drive modulation. As will be explained in turn, such a direct-drive modulation scheme as variously provided herein yields higher efficiency as more voltage is provided to the fundamental output frequency, because there is less harmonic content compared to a standard AD modulation scheme (sometimes called uniform-sampled modulation) where the OUTN signal changes at a rate equal in magnitude and opposite in direction to the OUTP signal). In some embodiments, the PWM signal is generated by passing each of an input period and an input duty cycle through corresponding sigma-delta circuits (e.g., first-order) to generate a refined period and a refined duty cycle, respectively. In some example embodiments, a threshold mapper uses a lookup table (LUT) or similar mechanism to select timing thresholds for rise times and fall times for each of the OUTP and OUTN signals, where the timing thresholds are selected based on the refined period and the refined duty cycle. In some embodiments, rise time and fall time offsets can be provided to the timing thresholds to compensate for any analog-based load effects. Based on the timing thresholds, a pulse generator forms square wave signals over time for both the OUTP and OUTN signals, according to some embodiments.

General Overview

As previously noted above, there remain a number of non-trivial issues associated with producing high-resolution PWM signals. These challenges may be more easily understood with an example. Many applications require a frequency sweep to drive and characterize a given load. A tight frequency resolution is desired to accurately capture the frequency response. For this purpose, if an analog sinewave $s_k$ at a frequency $f_k$ is to be generated with a PWM signal at frequency $f_{pwm}$, and assuming no frequency offsets, the following relation holds true:

$$s_k[n] = A_k \cdot \sin\left(\frac{2\pi \cdot f_k \cdot n}{f_{pwm}}\right), \qquad (1)$$

where k denotes the $k^{th}$ frequency in the sweep and n denotes the $n^{th}$ PWM period. The ratio $R_2 = f_{pwm}/f_k$ determines the number of PWM clock periods per sinewave period, which in turn affects signal distortion. As a result, the minimum ratio between the main clock and the maximum excitation frequency is:

$$\frac{f_{clk}}{f_{k_{max}}} = \frac{f_{clk}}{f_{pwm}} \frac{f_{pwm}}{f_{k_{max}}} = R_1 R_2. \quad (2)$$

For many PWM applications, such as when providing ultrasonic frequencies, $R_2$ should be minimized to achieve a practical implementation. In one example, to characterize the resonance points of an ultrasonic piezoelectrical actuator (such as those used for ultrasonically cleaning a lens on a camera that may become dirty due to moisture, dirt or other environmental factors), the frequency step may need to be less than 200 Hz for excitation frequencies between 44 kHz and 380 kHz. Assuming $R_2=1$, the time resolution needed can be calculated as:

$$\Delta T = (1/(380 \text{ kHz} - 200 \text{ Hz})) - 1/(380 \text{ kHz}) = 1/(379.8 \text{ kHz}) - 1/(380 \text{ kHz}) = 1.38 \text{ ns}. \quad (3)$$

This result means that a main PWM clock frequency of 1/1.38 ns=724 MHz or higher would be required, depending on the desired excitation frequency accuracy. But such a clock is about 1900 times faster than the highest excitation frequency (e.g., 380 kHz). Because the power dissipation of an oscillator is approximately proportional to frequency, a large ratio between the main PWM clock frequency and the PWM output frequency will yield relatively high power dissipation, which may be undesirable for some applications. However, the required resolution cannot be obtained using a lower frequency clock without some additional circuitry. Some techniques attempt to obtain a high PWM resolution with a lower frequency clock by using multi-phase delay locked loops that divide the main clock period into smaller pieces along with circuit logic that constantly changes the number of delay cells selected in the loop to achieve the required finer period accuracy. As previously explained, these techniques require logic that constantly changes the number of delay cells selected in the loop to achieve the required finer period accuracy. Such techniques additionally require calibration of the analog delay chain to account for process, voltage, and/or temperature variations.

Thus, and according to an embodiment of the present disclosure, a PWM generator is provided herein which enables high-resolution PWM signals with lower frequency clocks. In particular, the PWM generator refines both the period and duty cycle for a PWM signal using sigma-delta circuits. Based on the refined period and duty cycle, timing thresholds can be determined for each of a OUTP signal and OUTN signal, with the final resulting PWM signal being the difference between the two signals (OUTP−OUTN). According to some embodiments, a pulse generator forms a square wave signal for each of OUTP and OUTN such that OUTN is shifted in time by half a period from OUTP. This shift in time produces a direct-drive output when the difference between the signals is taken. The PWM generator can be implemented in any microcontroller, application specific integrated circuit (ASIC) or purpose-built semiconductor, or field programmable gate array (FPGA), to name a few examples.

In more detail, and according to some embodiments, the refined period and refined duty cycle for an output PWM signal is each dithered using a first-order sigma-delta circuit. Note that other embodiments may use a higher-order sigma-delta circuit (e.g., second-order), for example, to achieve higher performance levels (e.g., improved noise performance and/or higher dynamic range). But further note that such higher-order sigma-delta circuit may also increase frequency jitter. So, a trade-off assessment may be conducted to determine which order is suitable. According to some embodiments, each of the sigma-delta circuits uses an integrator to accumulate error associated with either the refined period or the refined duty cycle with a constant feedback loop designed to reduce the error in the output. Furthermore, each of the sigma-delta circuits refines the resolution using a scalar factor and quantizes the scaled output to achieve a resolution that is equivalent to a higher-frequency clock, according to some examples.

According to some embodiments, a threshold mapper uses the refined period and refined duty cycle to set timing thresholds for rise times and fall times of each of the OUTP signal and the OUTN signal. In order to produce a direct-drive PWM signal, the timing thresholds are set such that OUTP and OUTN are the same signals, but shifted in time by half a period from one another.

Using the techniques disclosed herein to produce PWM signals has a number of benefits compared with other PWM generation techniques. For example, the PWM generator digitally produces the refined period and duty cycle using the sigma-delta circuits, which drastically reduces circuit complexity and chip area usage compared to analog techniques. In another example, the direct-drive modulation of the output PWM signal yields a lower overall error across a range of excitation frequencies and fewer harmonics. Accordingly, more energy is focused at the fundamental excitation frequency when using the direct-drive modulation technique disclosed herein.

Signal Generator and PWM Generator Examples

FIG. 1 is a block diagram of an example signal generator 100 that uses pulse width modulation of digital signals to generate an analog output signal, in accordance with an embodiment of the present disclosure. Signal generator 100 may be designed, for example, to provide a frequency sweep across a given frequency range or a single output frequency. Signal generator 100 may be, for example, one part of a larger circuit or it may be packaged within a stand-alone integrated circuit (IC) chip. The various components of signal generator 100 may be provided together on the same chip (e.g., same semiconductor substrate) or across different chips (e.g., chip set).

Signal generator 100 includes a front-end processing circuit 102, a PWM generator 104, and an LC circuit 106, according to some embodiments. Front-end processing circuit 102 is designed to provide a period and duty cycle for the PWM signal generated by PWM generator 104. Alternatively, the period and duty cycle may each be input by a user, or otherwise given. In some cases, the period and duty cycle may be determined within front-end processing circuit 102 based on, for example, hardwired logic or programmable logic based on the application. For example, front-end processing circuit 102 may include edge detection circuitry that is used to detect the period and duty cycle of the PWM signal. In some cases, the edge detectors output a counter value in response to positive-going and negative-going edge triggers, with the counter being synchronized to the PWM clock. According to some embodiments, front-end processing circuit 102 also generates offsets that affect the relative rise times and fall times for the OUTP and OUTN PWM signals. These offsets are described in more detail herein, and may be predetermined based on analog circuitry used to drive LC circuit 106. According to some embodiments, the offsets are used to compensate for timing abnormalities caused by the driving analog circuitry.

According to some embodiments, PWM generator 104 receives the period and duty cycle and generates refined versions of both the period and the duty cycle. A differential PWM output signal (OUTP and OUTN) can then be generated based on the refined period and refined duty cycle, such that the output PWM signal looks as if it was generated using a faster clock. According to some embodiments, PWM generator 104 generates the output PWM signal as a direct-drive signal by shifting OUTN in time by a half period compared to OUTP, while both OUTN and OUTP have the same refined period and the same refined duty cycle. PWM generator 104 may also receive the offsets and use the offsets to shift the rise times and fall times of one or both OUTP and OUTN. Further details of PWM generator 104 are provided with reference to FIG. 2. Note that digital circuitry within PWM generator 104 is driven by a system clock CLK. In some embodiments, front-end processing circuit 102 also includes digital circuitry driven by a clock that may be the same clock that drives PWM generator 104, or it may use a different clock. In the latter case, signals from one clock domain can be synchronized to the other clock domain, as needed.

According to some embodiments, LC circuit 106 receives the differential PWM output signal made up of the difference between OUTP and OUTN and transforms the digital square wave signal into an analog output. Since the differential PWM output exhibits direct drive modulation according to some embodiments, the analog output signal has the same frequency as the PWM signal. In some examples, the analog output signal is used to drive an ultrasonic transducer. According to some embodiments, the circuit elements within LC circuit 106 are configured to filter the square wave shape of the output PWM signal into a roughly equivalent analog sine wave. LC circuit 106 may be, for example, a second-order LC circuit that includes at least one inductor (L) and at least one capacitor (C). According to some embodiments, the values for L and C may be chosen such that resonant frequency of LC circuit 106 is greater than the frequency of the output PWM signal (e.g., the inverse of the refined period), as shown below:

$$\frac{1}{2\pi\sqrt{LC}} > f_{PWM}. \quad (4)$$

Note that circuit features such as power (e.g., $V_{DD}$, $V_{CC}$, etc.) and ground (e.g., analog ground, digital ground, power ground, chassis ground, etc.) as well as supporting circuitry (e.g., upstream or downstream circuitry) may not be expressly described or depicted but will be apparent in light of this disclosure.

Figure 2:
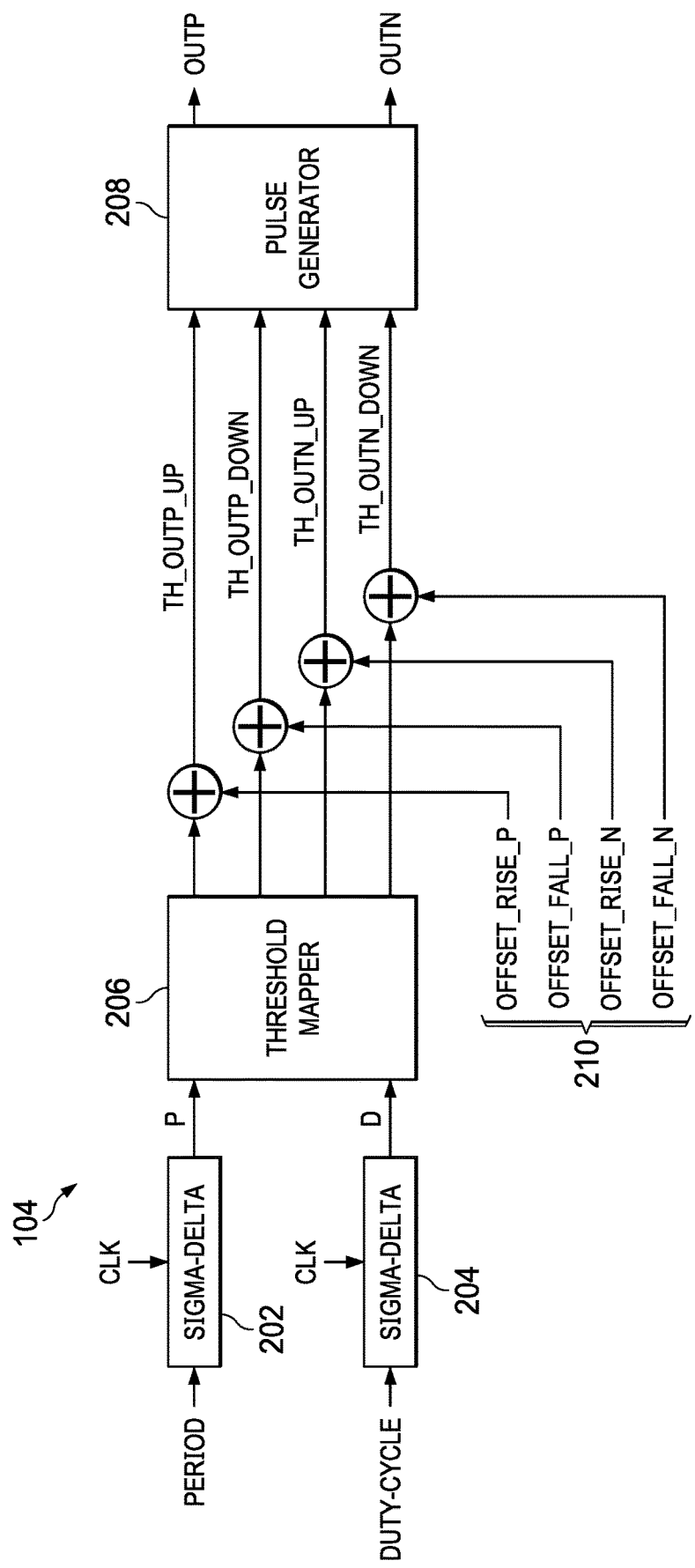
FIG. 2 is a block diagram of an example PWM generator, in accordance with an embodiment of the present disclosure.

FIG. 2 schematically illustrates details for the topology of PWM generator 104, according to some embodiments. In some embodiments, the various components of PWM generator 104 represent one or more integrated circuits (ICs) configured to carry out the functionalities provided herein. For instance, PWM generator 104 may generally be constructed with gate-level logic, such as a field programmable gate array (FPGA) or an application specific integrated circuit (ASIC). In such cases, PWM generator 104 may be designed or implemented using a hardware description language such as Very High-Speed Integrated Circuit (VHSIC) Hardware Description Language (VHDL) or Verilog. PWM generator 104 may be fabricated on a single die or split across multiple dies. In other embodiments, PWM generator 104 is implemented with one or more processors programmed or otherwise configured to carry out the functionalities provided herein. In a more general sense, PWM generator 104 may be implemented with functional hardware or a functional combination of hardware and software, and may include a number of discrete components populated on a printed circuit board (PCB), or a number of semiconductor devices populated on the same substrate within an integrated circuit package, whether alone or in combination with other components (e.g., card or chassis level PCB, or a system-on-chip).

According to some embodiments, PWM generator 104 includes a first sigma-delta circuit 202 configured to receive the period and digitally generate a refined period (P) and a second sigma-delta circuit 204 configured to receive the duty cycle and generate a refined duty cycle (D). Both sigma-delta circuits are driven by the system clock CLK. The details of both sigma-delta circuits are described more thoroughly with reference to FIGS. 3A and 3B.

The refined period (P) and refined duty cycle (D) for the output PWM signal are received by a threshold mapper 206 that is designed to set the timing thresholds for the rise times and fall times of the output PWM signals OUTP and OUTN. Threshold mapper 206 may include, for example, a look-up table (LUT) or some other hardwired or programmable logic to set the timing thresholds based on the values of the received refined period (P) and refined duty cycle (D). For example, four timing thresholds are determined to provide the rise time for the OUTP signal (TH_OUTP_UP), the fall time for the OUTP signal (TH_OUTP_DOWN), the rise time for the OUTN signal (TH_OUTN_UP), and the fall time for the OUTN signal (TH_OUTN_DOWN). These timing thresholds may be provided as-is directly from threshold mapper 206. However, in some embodiments, offsets 210 are added to each of the timing thresholds to compensate for timing errors induced by downstream analog circuitry. Any number of offsets can be provided. Although four offsets are illustrated for offsetting each of the timing threshold, only some of the timing thresholds may be offset in some examples.

According to some embodiments, pulse generator 208 generates the OUTP and OUTN square wave PWM signals based on the received timing thresholds and a counter to track when a full period has lapsed. Further details of the operation of pulse generator 208 are provided with reference to FIG. 4.

Figure 3A:
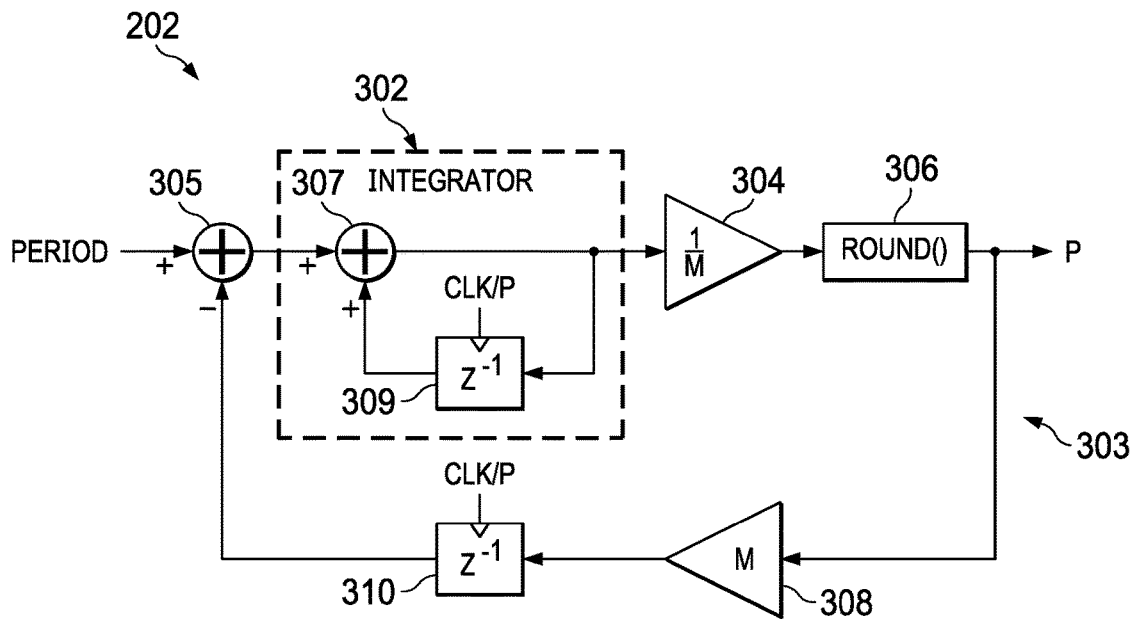
FIG. 3a schematically illustrates an example sigma-delta circuit configured to produce a refined period for a PWM signal, in accordance with an embodiment of the present disclosure.
Figure 3B:
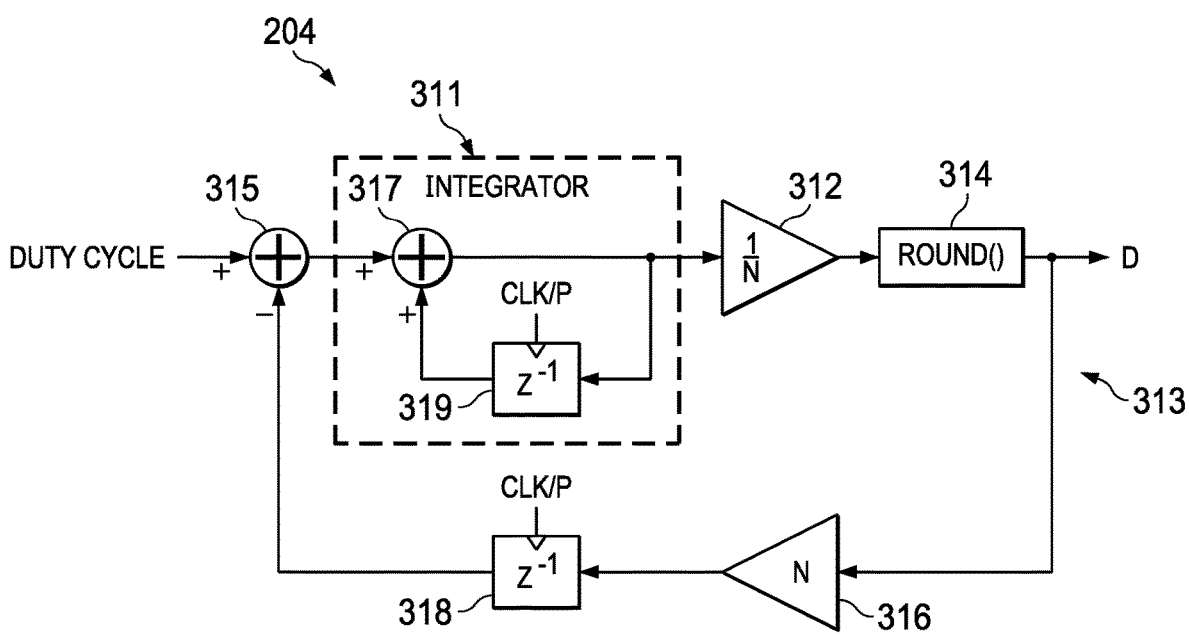
FIG. 3b schematically illustrates another example sigma-delta circuit configured to produce a refined duty cycle for a PWM signal, in accordance with an embodiment of the present disclosure.

FIGS. 3A and 3B illustrate more detailed schematics of sigma-delta circuits 202 and 204, respectively, according to some embodiments. The various digital components may be implemented, for example, using programmable gate logic or other hardwired transistor logic. Both sigma-delta circuits 202 and 204 are first-order modulators each having only one integrator block, according to some embodiments. Note that higher-order sigma-delta circuits could be used as well, as previously explained, but they tend to increase frequency jitter.

Sigma-delta circuit 202 includes an integrator block 302 designed to accumulate the error caused by the rounding (quantizing) performed on the refined period. A feedback loop 303 is formed to subtract the output from the input (at adder 305) thus generating an error to be accumulated at integrator block 302. This architecture is described in more detail with reference to the particular example provided below.

The received period represents the number of system clock (CLK) cycles that make up one period of the output PWM signal and it has its resolution reduced by a first gain stage 304 having a gain of 1/M with M being a first scalar factor, according to an embodiment. The scalar factor M dictates how much the period is reduced (e.g., fewer clock cycles of the system clock) and is equivalent to using a faster clock to generate the PWM signal. Since the period is the reciprocal of frequency, decreasing the period by a factor of M (using the 1/M gain stage 304) is equivalent to increasing the frequency by the same factor of M. For example, a scalar factor M of 8 achieves a resolution equivalent to an 800 MHz system clock when only using a 100 MHz system clock.

After the resolution of the period has been reduced, the output from the first gain stage 304 is rounded (e.g., quantized) using rounding stage 306. Rounding stage 306 may include any type of uniform or mid-tread quantizer. Any non-integer values resulting from applying the 1/M gain are rounded to the nearest integer value using rounding stage 306. The refined output period (P) is fed back via feedback loop 303 where it is increased via second gate stage 308 having a gain of M. Accordingly, any rounding error that occurs due to rounding stage 306 will be fed back to the input at adder 305 and accumulated at integrator block 302. Integrator block 302 includes an adder 307 to accumulate any error resulting from adder 305 and a feedback loop with a delay block 309. Delay block 309 may be or otherwise include, for example, a delay register that is driven by a clock signal having the same frequency as the output PWM signal. This frequency is equivalent to the system clock frequency divided by the refined period (CLK/P). Sigma-delta circuit 202 also includes another delay block 310 as part of feedback loop 303. As can be seen, delay block 310 may also include a delay register that is driven by the same clock frequency CLK/P.

A specific example is presented to better understand the operations of sigma-delta circuit 202. An input period of 25 (representing the number of system clock cycles in one period of the output PWM signal) may be received and passed through integrator block 302 where it is multiplied by a gain of ⅛ (e.g., a first scalar factor M of 8). Thus, the output from first gain stage 304 is 25/8. Because the output is not an integer, rounding stage 306 will quantize the value into a scalar integer, which in this example is 3 (e.g., round(25/8)=3). Thus, the refined period (P) is 3 (e.g., 3 clock cycles of the system clock CLK) given an input period of 25 and a first scalar factor M of 8. Note that the round operator can have several different meanings, such as converting the argument to the nearest integer in the negative infinity direction, converting the argument to the nearest integer in the positive infinity direction or converting the argument to the nearest integer. In this example, the round operator is converting the argument to the nearest integer. The refined period is fed via feedback loop 303 to second gain stage 308 where it is multiplied by the scalar factor M, thus generating an output of 24. Because rounding was performed, this output (24) will not match the input received (25). The difference is the error which is found by subtracting the feedback from the input at adder 305 (e.g., 25-24) to yield an error value of 1. This error is then accumulated at integrator block 302 where the process continues as the error continues to accumulate. That is, each pass through feedback loop 303 adds another error value of 1 to the period, which in this example continues to be rounded down to a refined period output of 3 so long as the period+accumulated error is less than 28. Once enough error has been accumulated (e.g., enough error is accumulated to make the output of first gain stage 304 equal to or greater than 3.5), the refined period (P) will increase to 4 since an input of 3.5 to rounding stage 306 rounds up to 4. However, the feedback caused by the higher output will then yield a negative error by subtracting 32 from 25 at adder 305 to effectively cancel out the accumulated error and bring the refined period (P) value back to 3.

Turning to sigma-delta circuit 204, the circuit includes an integrator block 311 designed to accumulate the error caused by the rounding (quantizing) performed on the refined duty cycle. A feedback loop 313 is formed to subtract the output from the input (at adder 315) thus generating an error to be accumulated at integrator block 311.

The received duty cycle has its resolution reduced by a first gain stage 312 having a gain of 1/N with N being a second scalar factor, according to an embodiment. The scalar factor N dictates how much the duty cycle resolution is increased and is equivalent to using a faster clock to generate the PWM signal. For example, a scalar factor N of 8 achieves a resolution equivalent to an 800 MHz clock when only using a 100 MHz system clock. In some embodiments, the scalar factors M and N are the same between sigma-delta circuits 202 and 204. However, in some examples the input resolution for the period and duty cycle may be different in which case the scalar factors M and N are also different to ensure that the output resolution for the refined period and the refined duty cycle are the same.

After the duty cycle resolution has been reduced, the output from the first gain stage 312 is rounded (e.g., quantized) using rounding stage 314. Rounding stage 314 may include any type of uniform or mid-tread quantizer. Any non-integer values resulting from applying the 1/N gain are rounded to the nearest integer value using rounding stage 314. The refined output duty cycle (D) is fed back via feedback loop 313 where it is increased via second gate stage 316 having a gain of N. Accordingly, any rounding error that occurs due to rounding stage 314 will be fed back to the input at adder 315 and accumulated at integrator block 311. Integrator block 311 includes an adder 317 to accumulate any error resulting from adder 315 and a feedback loop with a delay block 319. Delay block 319 may be or otherwise include a delay register that is driven by a clock signal having the same frequency as the output PWM signal. This frequency is equivalent to the system clock frequency divided by the refined period (CLK/P). Sigma-delta circuit 204 also includes another delay block 318 as part of feedback loop 313. As can be seen, delay block 318 may also be or otherwise include a delay register that is driven by the same clock frequency CLK/P. The example described above for detailing the operation of sigma-delta circuit 202 is equally applicable to sigma-delta circuit 204.

Example Timing Diagrams

Figure 4:
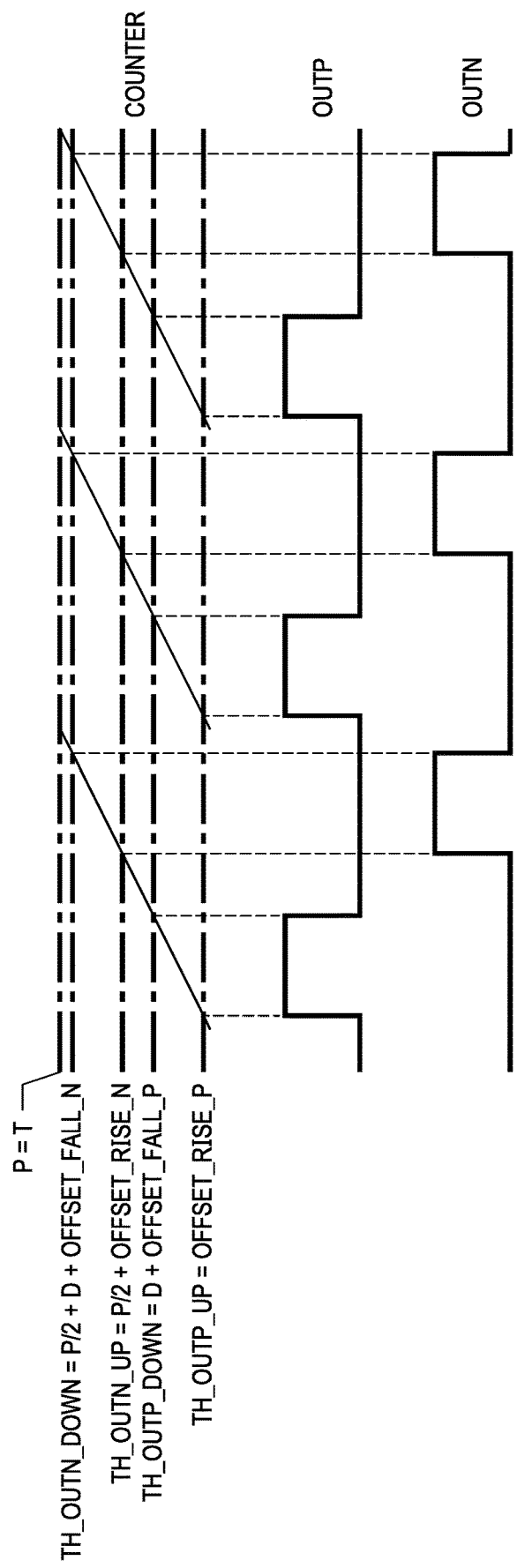
FIG. 4 illustrates an example timing diagram for the differential square wave output of a PWM generator based on different timing thresholds, in accordance with an embodiment of the present disclosure.

FIG. 4 illustrates a timing diagram that details the operation of pulse generator 208, according to some embodiments. The specific waveforms illustrated in the timing diagram of FIG. 4 provide just one example and waveforms having different periods and/or duty cycles can also be produced. As discussed above, pulse generator 208 includes a counter to track the number of clock pulses (e.g., the passage of time) and resets the counting after a period has elapsed. The parallel diagonal lines at the top of FIG. 4 represent the increasing count over time as the various timing thresholds (TH_OUTP_UP, TH_OUTP_DOWN, TH_OUTN_UP, and TH_OUTN_DOWN) are crossed before the end of the period is reached (when T=P) and the count starts over again (e.g., back at zero or at least before TH_OUTP_UP).

According to some embodiments, OUTP goes high when the COUNT=TH_OUTP_UP and goes low when COUNT=TH_OUTP_DOWN. For all other times, the state of OUTP does not change. Likewise, OUTN goes high when the COUNT=TH_OUTN_UP and goes low when COUNT=TH_OUTN_DOWN. For all other times, the state of OUTN does not change.

According to some embodiments, offsets have been included in the timing thresholds. The offsets may be in the form of 12-bit positive numbers that represent how many clock cycles in time the rise times and fall times of the respective OUTP and OUTN signals are delayed from the expected values. For example, TH_OUTP_UP can be set to a count value of 0 (or some other arbitrary starting point), but with the addition of OFFSET_RISE_P, TH_OUTP_UP becomes equal to OFFSET_RISE_P. Likewise, TH_OUTP_DOWN can be set to count value of D (e.g., the refined duty cycle), but with the addition of OFFSET_FALL_P, TH_OUTP_DOWN becomes equal to D+OFFSET_FALL_P. Likewise, TH_OUTN_UP can be set to a count value of P/2. By setting the rise time for OUTN to be half the period (P/2), the resulting differential PWM output signal is a direct-drive signal as will be discussed in more detail with reference to FIG. 5. However, with the addition of OFFSET_RISE_N, TH_OUTN_UP becomes equal to P/2+OFFSET_RISE_N. Likewise, TH_OUTN_DOWN can be set to count value of P/2+D, but with the addition of OFFSET_FALL_N, TH_OUTN_DOWN becomes equal to P/2+D+OFFSET_FALL_N. The presence of the offsets is why the OUTN signal is not offset by exactly P/2 from the OUTP signal. If no offsets were used, then OUTN would offset from OUTP by exactly P/2. In some embodiments, any of the offsets can be negative numbers such that the offsets may include both positive and negative numbers or all negative numbers.

FIG. 5A illustrates example waveforms for both OUTP and OUTN along with the differential PWM signal obtained by taking OUTP−OUTN, according to some embodiments. In this example, the refined duty cycle is 25% (signal is high for 25% of the period and low for the remaining 75% of the period). As discussed above, both OUTP and OUTN have the same period and duty cycle, but OUTN is shifted in time by half a period compared to OUTP. For this example, offsets are not considered and thus OUTN is shifted exactly half a period compared to OUTP.

Because OUTN is shifted in time by half a period and has the same duty cycle and period as OUTP, the differential PWM signal (OUTP−OUTN) yields a direct-drive waveform that drives the load like a sinewave. Furthermore, the duty cycle is chosen to control the energy delivered to the load while the total output is symmetric for lower distortion. According to some embodiments, achieving a direct-drive waveform means that the duty cycle cannot be greater than 50%, otherwise the logic high portions of the OUTP and OUTN waveforms would begin to overlap.

The Fourier series expansion of the direct-drive modulation illustrated in FIG. 5A can be shown as:

$$f(t) = \sum_{n=1}^{\infty} C_n \cos(2\pi f_{pwm} nt), \quad (4)$$

where $$C_n = \begin{cases} \dfrac{4A}{\pi n} \sin(D\pi n) & n \text{ odd} \\ 0 & n \text{ even} \end{cases} \quad (5)$$

In (5), A is the PWM excitation amplitude and D is the duty cycle, which is constant for a constant amplitude sweep. n denotes the $n^{th}$ harmonic. According to some embodiments, since a direct drive modulation is used, the PWM frequency $f_{pwm}$ is the same as the driving frequency $f_k$. Additionally, all even harmonics are 0 when the duty cycle is less than 50% meaning there is no power loss from even harmonics.

FIG. 5B illustrates example waveforms from a PWM generator that uses a more traditional uniform-sampled modulation technique to produce a differential PWM signal (PWM_P−PWM_N). Like the waveform in FIG. 5A, the duty cycle is 25% (signal is high for 25% of the period and low for the remaining 75% of the period). In the uniform-sampled modulation technique, PWM_P is the inverse signal of PWM_N (i.e., PWM_N is low when PWM_P is high and vice versa).

The Fourier series expansion of the uniform-sampled modulation illustrated in FIG. 5B can be shown as:

$$f(t) = C_0 + \sum_{n=1}^{\infty} C_n \cos(2\pi f_{PWM} nt), \quad (6)$$

where $$C_0 = A_{pwm}(2D - 1) \quad (7)$$

$$C_n = \frac{4A_{pwm}}{\pi n} \sin(D\pi n) \quad (8)$$

In (7) and (8), $A_{pwm}$ is the PWM excitation amplitude and D is the duty cycle, which changes every PWM cycle according to the following expression:

$$D(m) = \frac{A_k}{2A_{pwm}} \sin\left(2\pi \frac{f_k}{f_{pwm}} m\right) + 0.5 \quad (9)$$

where $A_k$ is the is the PWM excitation amplitude and m represents the PWM cycle. When using uniform-sampled modulation, the PWM frequency $f_{pwm}$ is not the same as the driving frequency $f_k$ and $A_k$ is not necessarily the same as $A_{pwm}$. Additionally, even harmonics are only equal to 0 for a constant duty cycle of 50%, which is often not a practical duty cycle to use. Accordingly, power losses are present at both even and odd harmonics when using uniform-sampled modulation.

Once the input signal at frequency $f_k$ modulates the carrier at $f_{pwm}$ via D(m), the Fourier series expansion of the uniform-sampled modulation can be shown as:

$$f(t) = A_k \cos(2\pi f_k t) + 2 \sum_{m=1}^{\infty} \frac{1 - J_0(A_k m\pi) \cos(m\pi)}{m\pi} \sin(2\pi m f_{pwm} t) - \sum_{m=1}^{\infty} \sum_{n=-\infty}^{\infty} \frac{J_n(A_k m\pi)}{m\pi} \sin\left(2\pi(m f_{pwm} + n f_k)t - \left(m - \frac{n}{2}\right)\pi\right), \quad (10)$$

where m and n represent the index of the harmonics of the PWM signal and input signals respectively and $J_n$ is the Bessel function of $n^{th}$ order. The first term in (10) includes the desired output, while the second and third terms represent aliases that must be filtered using, for example, an output LC filter. The second and third terms generate reactive power loses and the first harmonic that contributes to power loses will be at $f_{pwm}-f_k$ for an ideal input sine wave. In contrast, the direct-drive modulation technique, according to some embodiments of the present disclosure, has $f_{pwm}$ as a desired signal and a first harmonic that contributes to power loses at around $3f_{pwm}$.

Output Frequency Analysis

Figure 6:
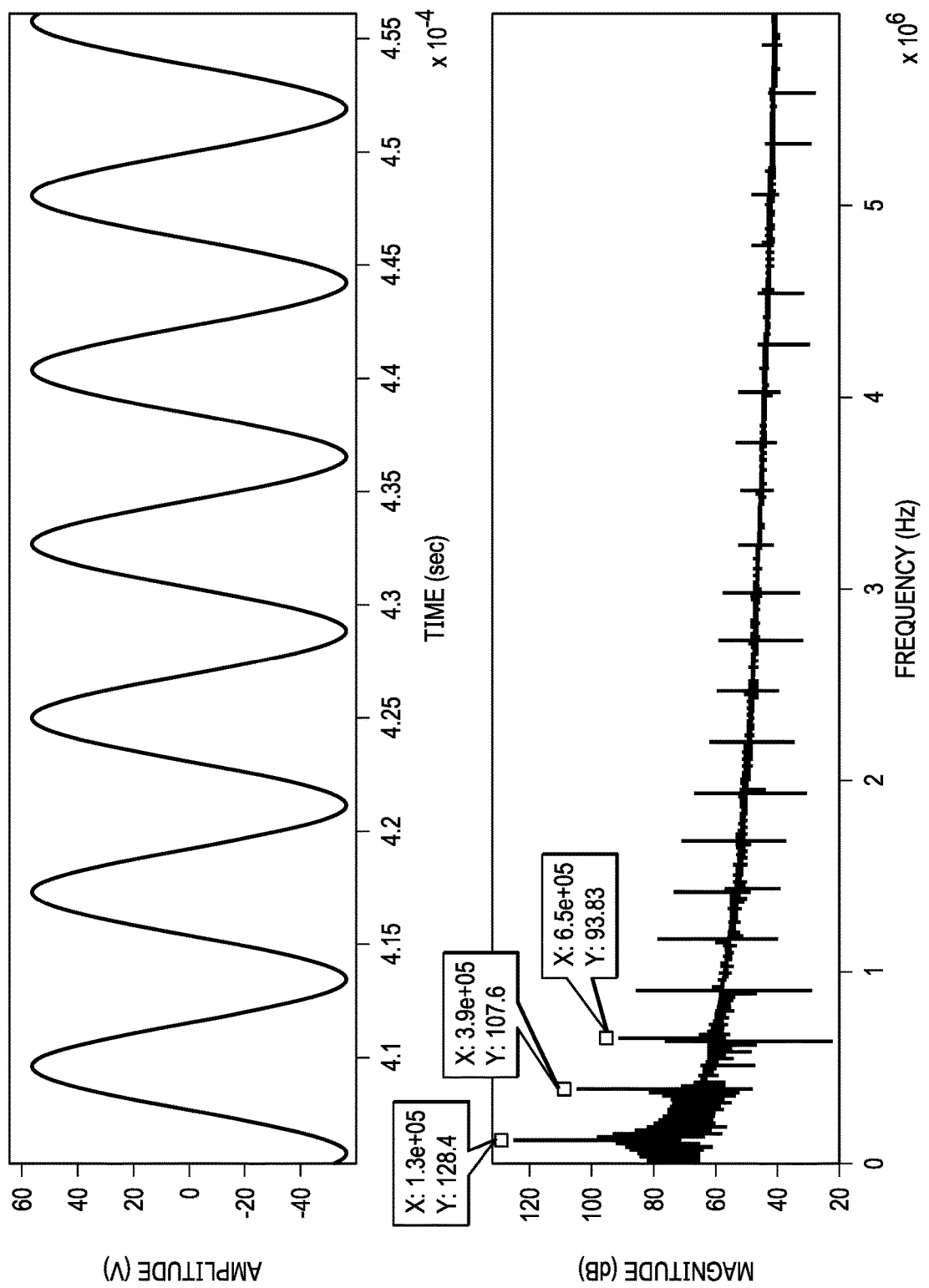
FIG. 6 illustrates example operating waveforms of the analog output of the signal generator of FIG. 1, in accordance with an embodiment of the present disclosure.

FIG. 6 illustrates an example output waveform and frequency analysis when using signal generator 100 having PWM generator 104, according to an embodiment. The ultrasonic frequencies being generated may be used for a variety of applications, such as for a lens cleaner to remove debris from the lens (e.g., a lens for a camera on a car, a drone, or any lens that is subject to the elements or can otherwise benefit from ultrasonic cleaning). The top graph illustrates an analog output (after being filtered through LC circuit 106) having a fundamental frequency of around 130 kHz. The direct-drive PWM signal ultimately yields a more symmetric analog sine wave output compared to other PWM modulation techniques (such as uniform-sampled modulation).

The bottom graph of FIG. 6 illustrates a fast Fourier transform (FFT) analysis of the frequency response to highlight the fundamental frequency and any harmonics. The fundamental frequency is observed with the highest magnitude at around 130 kHz with the two highest harmonic frequencies observed at around 390 kHz ($3^{rd}$ harmonic) and around 650 kHz ($5^{th}$ harmonic). Although some harmonic frequencies are virtually unavoidable in any frequency generator, the direct-drive PWM waveforms generated by PWM generator 104 exhibit fewer harmonics with lower amplitudes when compared to other PWM modulation techniques (such as uniform-sampled modulation).

Figure 7:
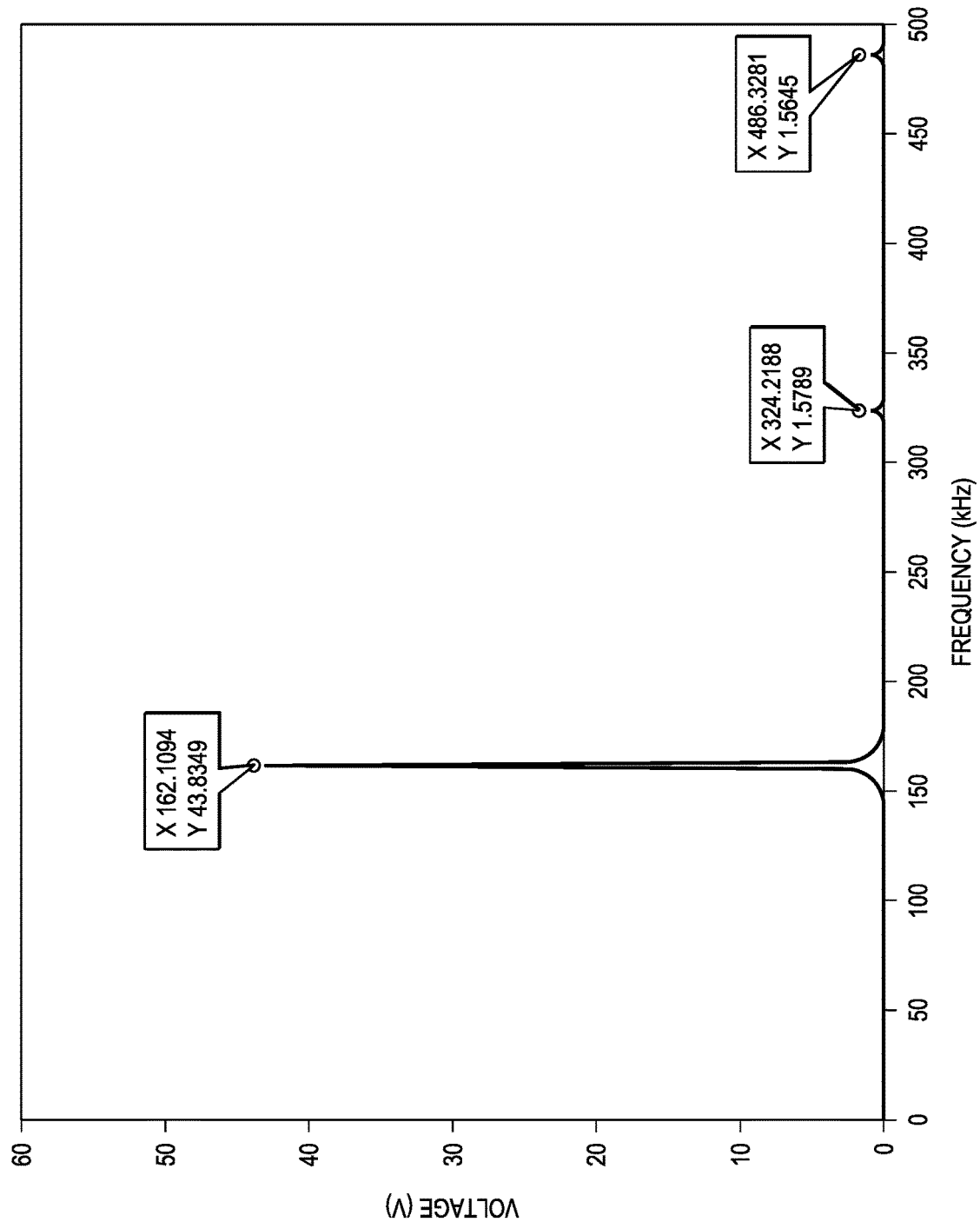
FIG. 7 illustrates a PWM signal voltage applied to a load at a fundamental frequency and at various frequency harmonics, in accordance with an embodiment of the present disclosure.

FIG. 7 illustrates another frequency response graph highlighting the voltage magnitude being delivered to the load from a waveform generated by signal generator 100 and having a fundamental frequency of around 162 kHz and a 25% duty cycle, according to an embodiment. Nearly all of the voltage delivered across the load is from the fundamental frequency (162 kHz) while the harmonic frequencies have very low amplitudes. Furthermore, a higher voltage amplitude is delivered at the fundamental frequency compared to other PWM modulation techniques (such as uniform-sampled modulation). As discussed above, the use of this excitation frequency (162 kHz) and a 25% duty cycle is particularly advantageous for exciting a piezoelectric transducer used in a lens cleaning system.

Some of the embodiments discussed herein may be implemented in hardware such as a field programmable gate array (FPGA) or application specific integrated circuit (ASIC) or purpose-built semiconductor that have functionality defined by hardware description languages such as very high-speed integrated circuit (VHSIC) hardware description language (VHDL) or Verilog. The hardware description language that defines the structure and functions of the hardware may be stored on any machine-readable medium or article. The machine-readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, or the like.

The term "couple" or "coupled" may cover connections, communications, or signal paths that enable a functional relationship consistent with this description. For example, if circuit or component A provides a signal to circuit or component B, in a first example circuit or component A is coupled to circuit or component B, or in a second example circuit or component A is coupled to circuit or component B through intervening circuit or component C if intervening circuit or component C does not substantially alter the functional relationship between A and B. In this sense, "coupled to" as used herein includes configurations that have direct coupling (where circuit or component A is directly coupled to circuit or component B, with no intervening component) as well as configurations that have indirect coupling (where circuit or component A is indirectly coupled to circuit or component B, via one or more intervening components C). In the latter case, the one or more intervening components C may be, for instance, a summing junction (an adder) that is coupled between an output of circuit or component A and an input of circuit or component B and that adds in a correction, offset or other adjustment factor to the signal from the output by circuit or component A, such that the input of circuit or component B receives an adjusted version of the signal output by circuit or component A. Note that the functional relationship between A and B in this example scenario remains unchanged, regardless of whether the signal from the output of A is adjusted by at least one component C before being received by the input of B. In such cases, the output of A is considered to be coupled (albeit indirectly) to the input of B.

A device (e.g., a circuit, or component) that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors may be described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein may be reconfigurable to include replaced components to provide functionality at least partially similar to functionality available prior to the component replacement. Components shown, unless otherwise stated, may be generally representative of any one or more elements coupled in series and/or parallel to provide a desired feature or function. For example, a resistor or capacitor depicted as a single component may instead be multiple resistors or capacitors, respectively, coupled in series and/or parallel between the same two nodes as the single resistor or capacitor, to provide a desired impedance; likewise, a register may be a set of registers coupled together to provide register of a desired size. Numerous other examples will be apparent.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

Further Example Embodiments

The following examples pertain to further embodiments, from which numerous permutations and configurations will be apparent.

Example 1 is a pulse width modulation (PWM) generator, comprising: a first sigma-delta circuit having a period input and a refined period output; a second sigma-delta circuit having a duty cycle input and a refined duty cycle output; a threshold mapper coupled to the refined period output of the first sigma-delta circuit and the refined duty cycle output of the second sigma-delta circuit, the threshold mapper having a first timing threshold output, a second timing threshold output, a third timing threshold output, and a fourth timing threshold output; and a pulse generator coupled to the first, second, third, and fourth timing threshold outputs of the threshold mapper, the pulse generator having at least one pulse width modulation (PWM) signal output.

Example 2 includes the PWM generator of Example 1, wherein the threshold mapper includes a look-up table (LUT) to select values for signals provided on any of the first, second, third, or fourth timing threshold outputs.

Example 3 includes the PWM generator of Example 1 or 2, wherein the first sigma-delta circuit includes a first integrator block having an adder and at least one delay circuit, and the second sigma-delta circuit includes a second integrator block having an adder and at least one delay circuit.

Example 4 includes the PWM generator of Example 3, wherein the first sigma-delta circuit includes a first gain stage coupled to an output of the first integrator block, the first gain stage having a gain of 1/M where M is equal to a first scalar factor, and the second sigma-delta circuit includes a second gain stage coupled to an output of the second integrator block, the second gain stage having a gain of 1/N where N is equal to a second scalar factor.

Example 5 includes the PWM generator of Example 4, wherein the first sigma-delta circuit includes a first rounding stage coupled to an output of the first gain stage, wherein an output of the first rounding stage is coupled to the refined period output of the first sigma-delta circuit, and the second sigma-delta circuit includes a second rounding stage coupled to an output of the second gain stage, wherein an output of the second rounding stage is coupled to the refined duty cycle output of the second sigma-delta circuit.

Example 6 includes the PWM generator of Example 5, wherein the first sigma-delta circuit includes a third gain stage coupled to the output of the first rounding stage, the third gain stage having a gain of M, and the second sigma-delta circuit includes a fourth gain stage coupled to the output of the second rounding stage, the fourth gain stage having a gain of N.

Example 7 includes the PWM generator of any of Examples 1 through 6, and further includes: a first adder having a first input coupled to the first timing threshold output of the threshold mapper, a second input configured to receive a first offset signal, and an output coupled to the pulse generator; a second adder having a first input coupled to the second timing threshold output of the threshold mapper, a second input configured to receive a second offset signal, and an output coupled to the pulse generator; a third adder having a first input coupled to the third timing threshold output of the threshold mapper, a second input configured to receive a third offset signal, and an output coupled to the pulse generator; and a fourth adder having a first input coupled to the fourth timing threshold output of the threshold mapper, a second input configured to receive a fourth offset signal, and an output coupled to the pulse generator.

Example 8 includes the PWM generator of any of Examples 1 through 7, wherein the at least one PWM signal output of the pulse generator includes a first PWM signal output and a second PWM signal output, wherein the pulse generator is configured to output a first signal having a refined period (P) and a refined duty cycle at the first PWM signal output and output a second signal having the refined period (P) and the refined duty cycle at the second PWM signal output, wherein the first signal is shifted in time with respect to the second signal by P/2. In some cases, the first and second signals are square wave signals, although other signal shapes may be used (e.g., triangle, sawtooth, or ramp signals).

Example 9 is a circuit for exciting a piezoelectric transducer, the circuit comprising: a first sigma-delta circuit having a period input and a refined period output; a second sigma-delta circuit having a duty-cycle input and a refined duty-cycle output; a threshold mapper coupled to the first sigma-delta circuit and the second sigma-delta circuit, the threshold mapper having a first threshold output, a second threshold output, a third threshold output and a fourth threshold output; a pulse generator coupled to the first, second, third and fourth threshold outputs and having a first pulse width modulation (PWM) signal output and a second PWM signal output; and circuitry coupled to the first PWM signal output and the second PWM signal output and having an analog output adapted to be coupled to the piezoelectric transducer.

Example 10 includes the circuit of Example 9, wherein the threshold mapper includes a look-up table (LUT) to select values for signals provided on any of the first, second, third, or fourth threshold outputs.

Example 11 includes the circuit of Example 9 or 10, and further includes: a first adder having a first input coupled to the first threshold output of the threshold mapper, a second input configured to receive a first offset signal, and an output coupled to the pulse generator; a second adder having a first input coupled to the second threshold output of the threshold mapper, a second input configured to receive a second offset signal, and an output coupled to the pulse generator; a third adder having a first input coupled to the third threshold output of the threshold mapper, a second input configured to receive a third offset signal, and an output coupled to the pulse generator; and a fourth adder having a first input coupled to the fourth threshold output of the threshold mapper, a second input configured to receive a fourth offset signal, and an output coupled to the pulse generator.

Example 12 includes the circuit of any of Examples 9 through 11, wherein the pulse generator is configured to provide a first square wave signal having a refined period (P) and a refined duty cycle at the first PWM signal output, and provide a second square wave signal having the refined period (P) and the refined duty cycle at the second PWM signal output, wherein the first square wave signal is shifted in time with respect to the second square wave signal by P/2.

Example 13 includes the circuit of any of Examples 9 through 12, wherein the first sigma-delta circuit includes a first integrator block having an adder and at least one delay circuit, and the second sigma-delta circuit includes a second integrator block having an adder and at least one delay circuit.

Example 14 includes the circuit of Example 13, wherein the first sigma-delta circuit includes a first gain stage coupled to an output of the first integrator block, the first gain stage having a gain of 1/M where M is equal to a first scalar factor, and the second sigma-delta circuit includes a second gain stage coupled to an output of the second integrator block, the second gain stage having a gain of 1/N where N is equal to a second scalar factor.

Example 15 includes the circuit of Example 14, wherein the first sigma-delta circuit includes a first rounding stage coupled to an output of the first gain stage, wherein an output of the first rounding stage is coupled to the refined period output of the first sigma-delta circuit, and the second sigma-delta circuit includes a second rounding stage coupled to an output of the second gain stage, wherein an output of the second rounding stage is coupled to the refined duty cycle output of the second sigma-delta circuit.

Example 16 includes the circuit of Example 15, wherein the first sigma-delta circuit includes a third gain stage coupled to the output of the first rounding stage, the third gain stage having a gain of M, and the second sigma-delta circuit includes a fourth gain stage coupled to the output of the second rounding stage, the fourth gain stage having a gain of N.

Example 17 is an ultrasonic cleaning system comprising: the circuit of any of Examples 9 through 16; and a piezoelectric transducer, wherein the piezoelectric transducer is excitable at ultrasonic frequencies in response to receiving the analog output.

Example 18 is a method for generating a PWM signal, the method comprising: receiving an input period for the PWM signal at a first sigma-delta circuit; refining, using the first sigma-delta circuit, the input period using a first scalar factor to produce a refined period; receiving an input duty cycle for the PWM signal at a second sigma-delta circuit; refining, using the second sigma-delta circuit, the input duty cycle using a second scalar factor to produce a refined duty cycle; generating timing thresholds for a rise time and a fall time of the PWM signal based on both the refined period and the refined duty cycle; and generating an OUTP signal having the refined period (P) and the refined duty cycle based on the timing thresholds, and generating an OUTN signal having the refined period (P) and the refined duty cycle based on the timing thresholds, wherein the OUTN signal is shifted in time with respect to the OUTP signal by P/2.

Example 19 includes the method of Example 18, wherein generating the timing thresholds includes using a look-up table (LUT) to select the rise time and fall time based on the refined period and the refined duty cycle.

Example 20 includes the method of Example 18 or 19, and includes: accumulating an error associated with the refined period using an integrator of the first sigma-delta circuit; and accumulating an error associated with the refined duty cycle using an integrator of the second sigma-delta circuit.

Example 21 includes the method of Example 20, wherein refining the input period includes applying a first gain of 1/M to the input period to produce a period-gain signal where M is equal to the first scalar factor, and wherein refining the input duty cycle includes applying a second gain of 1/N to the input duty cycle to produce a duty cycle-gain signal where N is equal to the second scalar factor.

Example 22 includes the method of Example 21, wherein refining the input period includes quantizing the period-gain signal to produce the refined period, and wherein refining the input duty cycle includes quantizing the duty cycle-gain signal to produce the refined duty cycle.

Example 23 includes the method of any of Examples 18 through 22, and includes adding the timing threshold for the rise time of the PWM signal with a rise time offset to produce a first offset signal; and adding the timing threshold for the fall time of the PWM signal with a fall time offset to produce a second offset signal.

Example 24 includes the method of Example 23, wherein generating the OUTP signal includes generating the OUTP signal based on the timing thresholds and the first offset signal, and wherein generating the OUTN signal includes generating the OUTN signal based on the timing thresholds and the second offset signal.

The foregoing description of example embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

The invention claimed is:

1. A pulse width modulation (PWM) generator, comprising:
   a first sigma-delta circuit having a period input and a refined period output;
   a second sigma-delta circuit having a duty cycle input and a refined duty cycle output;
   a threshold mapper coupled to the refined period output of the first sigma-delta circuit and the refined duty cycle output of the second sigma-delta circuit, the threshold mapper having a first timing threshold output, a second timing threshold output, a third timing threshold output, and a fourth timing threshold output; and
   a pulse generator coupled to the first, second, third, and fourth timing threshold outputs of the threshold mapper, the pulse generator having at least one pulse width modulation (PWM) signal output.

2. The PWM generator of claim 1, wherein the threshold mapper includes a look-up table (LUT) to select values for signals provided on any of the first, second, third, or fourth timing threshold outputs.

3. The PWM generator of claim 1, wherein the first sigma-delta circuit includes a first integrator block having an adder and at least one delay circuit, and the second sigma-delta circuit includes a second integrator block having an adder and at least one delay circuit.

4. The PWM generator of claim 3, wherein the first sigma-delta circuit includes a first gain stage coupled to an output of the first integrator block, the first gain stage having a gain of 1/M where M is equal to a first scalar factor, and the second sigma-delta circuit includes a second gain stage coupled to an output of the second integrator block, the second gain stage having a gain of 1/N where N is equal to a second scalar factor.

5. The PWM generator of claim 4, wherein the first sigma-delta circuit includes a first rounding stage coupled to an output of the first gain stage, wherein an output of the first rounding stage is coupled to the refined period output of the first sigma-delta circuit, and the second sigma-delta circuit includes a second rounding stage coupled to an output of the second gain stage, wherein an output of the second rounding stage is coupled to the refined duty cycle output of the second sigma-delta circuit.

6. The PWM generator of claim 5, wherein the first sigma-delta circuit includes a third gain stage coupled to the output of the first rounding stage, the third gain stage having a gain of M, and the second sigma-delta circuit includes a fourth gain stage coupled to the output of the second rounding stage, the fourth gain stage having a gain of N.

7. The PWM generator of claim 1, further comprising:
a first adder having a first input coupled to the first timing threshold output of the threshold mapper, a second input configured to receive a first offset signal, and an output coupled to the pulse generator;
a second adder having a first input coupled to the second timing threshold output of the threshold mapper, a second input configured to receive a second offset signal, and an output coupled to the pulse generator;
a third adder having a first input coupled to the third timing threshold output of the threshold mapper, a second input configured to receive a third offset signal, and an output coupled to the pulse generator; and
a fourth adder having a first input coupled to the fourth timing threshold output of the threshold mapper, a second input configured to receive a fourth offset signal, and an output coupled to the pulse generator.

8. The PWM generator of claim 1, wherein the at least one PWM signal output of the pulse generator includes a first PWM signal output and a second PWM signal output, wherein the pulse generator is configured to output a first signal having a refined period (P) and a refined duty cycle at the first PWM signal output and output a second signal having the refined period (P) and the refined duty cycle at the second PWM signal output, wherein the first signal is shifted in time with respect to the second signal by P/2.

9. A circuit for exciting a piezoelectric transducer, the circuit comprising:
a first sigma-delta circuit having a period input and a refined period output;
a second sigma-delta circuit having a duty-cycle input and a refined duty-cycle output;
a threshold mapper coupled to the first sigma-delta circuit and the second sigma-delta circuit, the threshold mapper having a first threshold output, a second threshold output, a third threshold output and a fourth threshold output;
a pulse generator coupled to the first, second, third and fourth threshold outputs and having a first pulse width modulation (PWM) signal output and a second PWM signal output; and
circuitry coupled to the first PWM signal output and the second PWM signal output and having an analog output adapted to be coupled to the piezoelectric transducer.

10. The circuit of claim 9, wherein the threshold mapper includes a look-up table (LUT) to select values for signals provided on any of the first, second, third, or fourth threshold outputs.

11. The circuit of claim 9, further comprising:
a first adder having a first input coupled to the first threshold output of the threshold mapper, a second input configured to receive a first offset signal, and an output coupled to the pulse generator;
a second adder having a first input coupled to the second threshold output of the threshold mapper, a second input configured to receive a second offset signal, and an output coupled to the pulse generator;
a third adder having a first input coupled to the third threshold output of the threshold mapper, a second input configured to receive a third offset signal, and an output coupled to the pulse generator; and
a fourth adder having a first input coupled to the fourth threshold output of the threshold mapper, a second input configured to receive a fourth offset signal, and an output coupled to the pulse generator.

12. The circuit of claim 9, wherein the pulse generator is configured to provide a first square wave signal having a refined period (P) and a refined duty cycle at the first PWM signal output, and provide a second square wave signal having the refined period (P) and the refined duty cycle at the second PWM signal output, wherein the first square wave signal is shifted in time with respect to the second square wave signal by P/2.

13. The circuit of claim 9, wherein the first sigma-delta circuit includes a first integrator block having an adder and at least one delay circuit, and the second sigma-delta circuit includes a second integrator block having an adder and at least one delay circuit.

14. The circuit of claim 13, wherein the first sigma-delta circuit includes a first gain stage coupled to an output of the first integrator block, the first gain stage having a gain of 1/M where M is equal to a first scalar factor, and the second sigma-delta circuit includes a second gain stage coupled to an output of the second integrator block, the second gain stage having a gain of 1/N where N is equal to a second scalar factor.

15. The circuit of claim 14, wherein the first sigma-delta circuit includes a first rounding stage coupled to an output of the first gain stage, wherein an output of the first rounding stage is coupled to the refined period output of the first sigma-delta circuit, and the second sigma-delta circuit includes a second rounding stage coupled to an output of the second gain stage, wherein an output of the second rounding stage is coupled to the refined duty cycle output of the second sigma-delta circuit.

16. The circuit of claim 15, wherein the first sigma-delta circuit includes a third gain stage coupled to the output of the first rounding stage, the third gain stage having a gain of M, and the second sigma-delta circuit includes a fourth gain stage coupled to the output of the second rounding stage, the fourth gain stage having a gain of N.

17. An ultrasonic cleaning system comprising: the circuit of claim 9; and a piezoelectric transducer, wherein the piezoelectric transducer is excitable at ultrasonic frequencies in response to receiving the analog output.

18. A method for generating a PWM signal, the method comprising:
- receiving an input period for the PWM signal at a first sigma-delta circuit;
- refining, using the first sigma-delta circuit, the input period using a first scalar factor to produce a refined period;
- receiving an input duty cycle for the PWM signal at a second sigma-delta circuit;
- refining, using the second sigma-delta circuit, the input duty cycle using a second scalar factor to produce a refined duty cycle;
- generating timing thresholds for a rise time and a fall time of the PWM signal based on both the refined period and the refined duty cycle; and
- generating an OUTP signal having the refined period (P) and the refined duty cycle based on the timing thresholds, and generating an OUTN signal having the refined period (P) and the refined duty cycle based on the timing thresholds, wherein the OUTN signal is shifted in time with respect to the OUTP signal by P/2.

19. The method of claim 18, wherein generating the timing thresholds includes using a look-up table (LUT) to select the rise time and fall time based on the refined period and the refined duty cycle.

20. The method of claim 18, comprising:
- accumulating an error associated with the refined period using an integrator of the first sigma-delta circuit; and
- accumulating an error associated with the refined duty cycle using an integrator of the second sigma-delta circuit.

21. The method of claim 20, wherein refining the input period includes applying a first gain of 1/M to the input period to produce a period-gain signal where M is equal to the first scalar factor, and wherein refining the input duty cycle includes applying a second gain of 1/N to the input duty cycle to produce a duty cycle-gain signal where N is equal to the second scalar factor.

22. The method of claim 21, wherein refining the input period includes quantizing the period-gain signal to produce the refined period, and wherein refining the input duty cycle includes quantizing the duty cycle-gain signal to produce the refined duty cycle.

23. The method of claim 18, comprising:
- adding the timing threshold for the rise time of the PWM signal with a rise time offset to produce a first offset signal; and
- adding the timing threshold for the fall time of the PWM signal with a fall time offset to produce a second offset signal.

24. The method of claim 23, wherein generating the OUTP signal includes generating the OUTP signal based on the timing thresholds and the first offset signal, and wherein generating the OUTN signal includes generating the OUTN signal based on the timing thresholds and the second offset signal.

* * * * *